United States Patent
Takahashi

(10) Patent No.: US 6,743,704 B2
(45) Date of Patent: Jun. 1, 2004

(54) METHOD OF MANUFACTURING A SEMICONDUCTOR DEVICE

(75) Inventor: Masashi Takahashi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/278,793

(22) Filed: Oct. 24, 2002

(65) Prior Publication Data

US 2004/0002185 A1 Jan. 1, 2004

(30) Foreign Application Priority Data

Jun. 26, 2002 (JP) ........................................ 2002/186767

(51) Int. Cl.[7] ............................ H01L 21/22; H01L 21/38
(52) U.S. Cl. ......................... 438/559; 438/592; 438/593
(58) Field of Search ................................ 438/192–233, 438/559, 592, 593

(56) References Cited

U.S. PATENT DOCUMENTS

| | | | | |
|---|---|---|---|---|
| 5,550,079 A | * | 8/1996 | Lin | 438/587 |
| 5,710,072 A | * | 1/1998 | Krautschneider et al. | 438/197 |
| 5,897,349 A | * | 4/1999 | Agnello | 438/230 |
| 5,981,320 A | * | 11/1999 | Lee | 438/199 |
| 6,225,155 B1 | * | 5/2001 | Lin et al. | 438/238 |
| 6,258,647 B1 | * | 7/2001 | Lee et al. | 438/233 |
| 6,436,749 B1 | * | 8/2002 | Tonti et al. | 438/199 |
| 6,495,408 B1 | * | 12/2002 | Hsia et al. | 438/214 |
| 6,506,647 B2 | * | 1/2003 | Kuroda et al. | 438/275 |
| 6,524,904 B1 | * | 2/2003 | Segawa et al. | 438/232 |

FOREIGN PATENT DOCUMENTS

| | | |
|---|---|---|
| JP | 10125916 A | 5/1998 |
| JP | 10189763 A | 7/1998 |
| JP | 10340962 A | 12/1998 |
| JP | 11297852 A | 10/1999 |
| JP | 2000031481 A | 1/2000 |

* cited by examiner

Primary Examiner—George Fourson
Assistant Examiner—Fernando Toledo
(74) Attorney, Agent, or Firm—Volentine Francos, PLLC

(57) ABSTRACT

A CMOSFET in which a p-type gate electrode and an n-type gate electrode are formed on a silicon substrate. The p-type gate electrode includes, in order, a p-type polycrystalline silicon layer and a tungsten silicide layer. The n-type gate electrode includes, in order, an n-type polycrystaline silicon layer and a tungsten silicide layer. A carbon-containing polycrystalline silicon layer, which is an impurity thermal diffusion prevention layer to suppress the interdiffusion of impurities, is provided between the p-type polycrystalline silicon layer and the tungsten silicide layer.

16 Claims, 9 Drawing Sheets

METHOD OF MANUFACTURING A SEMICONDUCTOR DEVICE

BACKGROUND OF THE INVENTION

1. Field of the Invention

This invention relates to a semiconductor device, and in particular to a dual-gate complementary MOS field-effect transistor (CMOSFET), and to a method of manufacturing same.

2. Description of Related Art

A complementary MOSFET, fabricated from an n-channel MOS field-effect transistor (nMOSFET) and a p-channel MOS field-effect transistor (pMOSFET), has attracted attention as an integrated circuit enabling operation under a low consumption current and high-speed operation.

A layered structure (polyside structure), in which for example polycrystalline silicon layers and metal silicide ($WSi_x$ or similar) layers are stacked on a gate insulating layer, is widely adopted in each of the gate electrodes of a CMOSFET. Here W represents a metal element, and x indicates the composition ratio. In particular, a dual-gate CMOSFET, in which are provided an n+ gate electrode in which n type impurities (an n dopant) are implanted in a polysilicon layer on the nMOSFET side and a p+ gate electrode in which p type impurities (a p dopant) are implanted in the polysilicon layer on the pMOSFET side, has a structure which is effective for suppressing the short-channel effect.

Each of the gate electrodes of a dual-gate CMOSFET is formed by patterning a common layered structure into a gate electrode shape. This common layered structure is formed by, for example, stacking a metal silicide layer on top of a polycrystalline silicon layer. This polycrystalline silicon layer is provided on top of a substrate, and has two impurity diffusion regions, in which n type and p type impurities are respectively diffused.

However, in the process to manufacture a dual-gate CMOSFET, after forming the common layered structure, the common layered structure is heat-treated at high temperatures.

As a result, when for example activating the impurities which have been implanted in the polycrystalline silicon layers of each gate electrode after formation of the metal silicide layer, due to the high-temperature heat treatment of the metal silicide layer, the n type and p type impurities which are diffused in the polycrystalline silicon layer undergo interdiffusion through the metal silicide layer. As a result of this interdiffusion, the n type and p type impurities compensate each other.

Hence in gate electrodes formed from a layered structure in which compensation occurs due to interdiffusion, the threshold voltage $V_{th}$ fluctuates due to enlargement of the depletion layer when a voltage is applied, so that the CMOSFET characteristics are degraded.

In order to suppress the degradation of CMOSFET characteristics, a method has been proposed in which the CMOSFET is configured with sufficient distance provided between the nMOSFET and pMOSFET, by broadening the portion in which the device isolation film exists or by similar means. However, this method is not well-suited to finer device patterns and higher integration densities.

Another method, in which the heat-treatment temperature in the heat-treatment process is suppressed, has also been proposed. However, as a result of suppression of the heat-treatment temperature, activation of the implanted impurities is insufficient, and consequently the contact resistance is increased and recovery of lattice defects is inadequate. That is, when this method is used, the performance and reliability of the device are worsened.

Thus one object of this invention is to provide a semiconductor device and manufacturing method in which interdiffusion of n type and p type impurities diffused in a polycrystalline silicon layer is suppressed.

SUMMARY OF THE INVENTION

A semiconductor device manufacturing method of this invention has the following features with regard to configuration.

The manufacturing method, used to manufacture a semiconductor device comprising a first gate electrode and a second gate electrode provided at a distance from the first gate electrode, comprises the following processes (a) through (e). However, the first gate electrode has a first impurity diffusion layer with a first conduction type formed on a polycrystalline[i] silicon layer and a high-melting-point metal layer or high-melting-point metal silicide layer, formed in sequence. Also, the second gate electrode has a second impurity diffusion layer with a second conduction type formed on a polycrystalline silicon layer and a high-melting-point metal layer or high-melting-point metal silicide layer, formed in sequence.

(a) First and second conduction type impurities are respectively implanted into mutually different first and second regions in a polycrystalline silicon layer, from above the polycrystalline layer. (Impurity implantation process)

(b) After the impurity implantation process, an impurity thermal diffusion prevention layer is formed on the polycrystalline silicon layer. This impurity thermal diffusion prevention layer acts to prevent the diffusion of impurities implanted into the polycrystalline silicon layer. (Impurity thermal diffusion prevention layer formation process)

(c) A high-melting-point metal layer or high-melting-point metal silicide layer is formed so as to cover the polycrystalline silicon layer in which the first region and second region exist. A compound layer is formed comprising the polycrystalline silicon layer, in which are implanted impurities of the first and second conduction types; an impurity thermal diffusion prevention layer; and a high-melting-point metal layer or high-melting-point metal silicide layer. (Compound layer formation process)

(d) Heat treatment of the compound layer is performed. The first and second impurities, implanted in the first and second regions, are diffused in the polycrystalline silicon layer. First and second impurity diffusion layers are formed. (Diffusion layer formation process)

(e) The layers comprising the above polycrystalline silicon layer, in which are formed the above first and second impurity diffusion layers, the above impurity thermal diffusion prevention layer, and the above high-melting-point metal layer or high-melting-point metal silicide layer is patterned. The above first and second gate electrodes are formed. (Electrode formation process)

According to the method of manufacture of a semiconductor device of this invention, an impurity thermal diffusion prevention layer provided on top of a polycrystalline silicon layer can be made to function as a stopper layer to suppress the interdiffusion of impurities during high-temperature heat treatment.

Hence the occurrence of fluctuations in the threshold voltage $V_{th}$ can be suppressed, accompanying suppression of the interdiffusion of impurities, so that semiconductor devices with high reliability, and compatible with high integration densities, can be obtained.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Figure 1A:
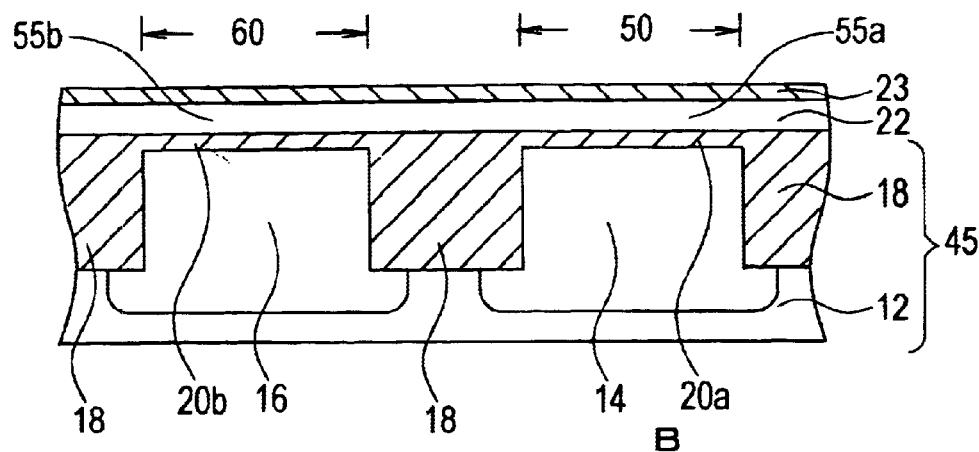
FIG. 1A, FIG. 1B and FIG. 1C are cross-sectional views which explain processes in the manufacture of the semiconductor device of a first aspect of this invention.

Below, aspects of the invention are explained referring to FIGS. 1A through 11C. Each of the drawings is a process diagram showing one configuration example of a method of semiconductor device manufacture of this invention, in cross-section. Each drawing shows in summary the shapes, sizes, and positional relations of the constituent components only in sufficient degree to enable understanding of the invention, and the scope of the invention is not limited to the illustrated example. In order to facilitate understanding of the drawings, hatchmarks (diagonal lines) indicating a cross-section are omitted, except in certain areas. In the following explanation, specific materials and conditions may be used; but these materials and conditions are no more than suitable examples, and so do not in any way limit the scope of the invention. In the drawings, similar constituent components are assigned the same numbers, and redundant explanations may be omitted. In the following explanations, examples are explained in which the first electrode is the p type and the second electrode is the n type; but it is clear to a practitioner of the art that this may be reversed, with the first electrode being the n type and the second electrode being the p type.

First Embodiment

The semiconductor device and manufacturing method for same of a first aspect of this invention are explained below, referring to FIGS. 1A through 3.

Figure 3:
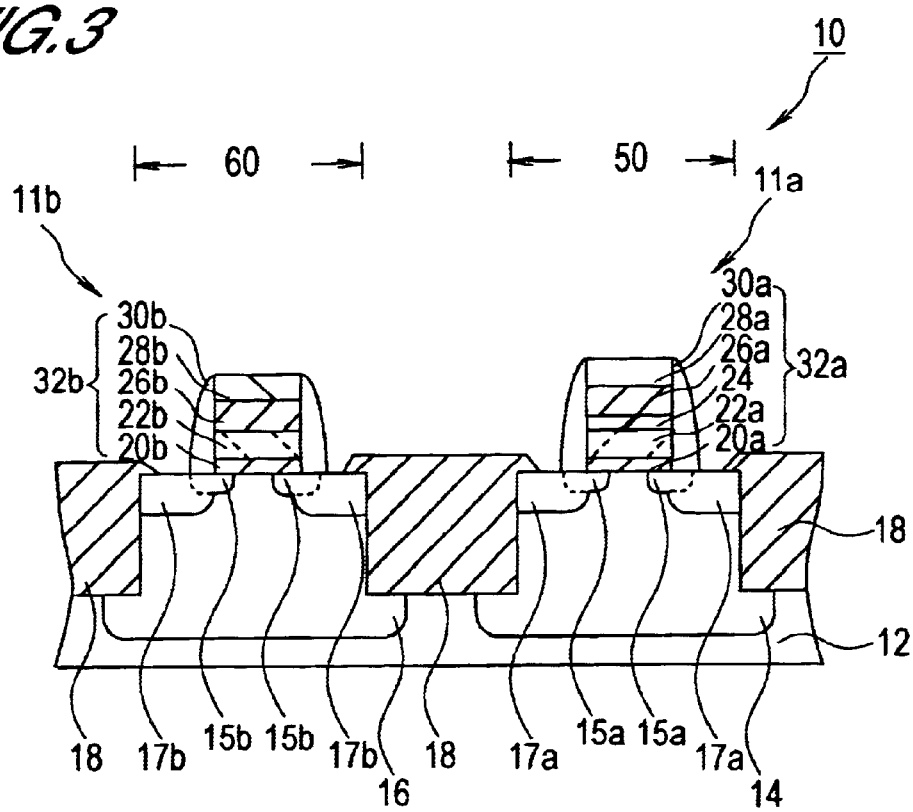
FIG. 3 is a cross-sectional view of the semiconductor device of the first and fourth aspects of this invention.

FIG. 3 shows a dual-gate CMOSFET 10 which is a semiconductor device of this aspect. This semiconductor device comprises a pMOSFET 11a and an nMOSFET 11b. On the silicon substrate 12 on which the CMOSFET 10 is formed, a device isolation film (for example, a silicon oxide film) 18, which electrically insulates and isolates the pMOSFET formation region 50 and the nMOSFET formation region 60, is formed. An n-well region 14, which is a channel region for the pMOSFET, is formed in the pMOSFET formation region 50. A p-well region 16, which is a channel region for the nMOSFET, is formed in the nMOSFET formation region 60. In the upper portion of the n-well region 14 are formed a p-type LDD (lightly doped drain) region 15a, containing p-type impurities, and a p-type source/drain region 17a. In the upper portion of the p-well region 16 are formed an n-type LDD region 15b, containing n-type impurities, and an n-type source/drain region 17b.

A first gate electrode 32a, which is the first gate electrode, is formed on the n-well region 14. The first gate electrode 32a comprises a first polycrystalline silicon layer 22a containing p-type impurities, a carbon-containing polycrystalline silicon layer 24 as an impurity thermal diffusion prevention layer, a tungsten silicide (WSi$_x$) layer 26a which is a first metallic conductive layer (high-melting-point metal layer or high-melting-point metal silicide layer), offset oxide film 28a, and side wall (for example, silicon oxide film) 30a, formed on a first gate oxide (insulating) film (for example, silicon oxide film) 20a. At the same time, a second gate electrode 32b which is the second electrode is formed on the p-well region 16. The second gate electrode 32b comprises a second polycrystalline silicon layer 22b containing n-type impurities, a tungsten silicide layer 26b which is a second metallic conductive layer, an offset oxide film 28b, and a side wall 30b, formed on a second gate oxide film 20b.

Next, the method of manufacture of this CMOSFET 10 is explained.

First, in the impurity implantation process, impurities of the first and second conduction types (p-type and n-type impurities) are separately implanted, from above a polycrystalline silicon layer, into first and second regions provided at different positions in the above common polycrystalline silicon layer.

Specifically, a device isolation film 18, which insulates and separates the pMOSFET formation region 50 and nMOSFET formation region 60, is formed on the silicon substrate 12.

Then, phosphorus (P) or other n-type impurities are implanted into a prescribed region of the silicon substrate 12 in the pMOSFET formation region 50, to form an n-well region 14. Also, boron (B) or other p-type impurities are implanted into a prescribed region of the silicon substrate 12 in the nMOSFET formation region 60, to form a p-well region 16. Then, pyrogenic oxidation is employed to form a first gate oxide film 20a on the upper face of the silicon substrate 12 exposed in the pMOSFET formation region 50, and to form a second gate oxide film 20b on the upper face of the silicon substrate 12 exposed in the nMOSFET formation region 60. It is preferable that these gate oxide films 20a and 20b be formed to film thicknesses in the range 1.5 nm to 10 nm. In this way, a base layer 45 is formed in which the principal components of the above-described MOSFETs are fabricated in a common silicon substrate 12.

Next, a well-known method of the prior art is used to form a polycrystalline silicon layer 22 over the entirety of the silicon substrate 12 including both of the gate oxide films (20a, 20b) on the base layer 45, preferably formed continuously with a film thickness in the range 100 nm to 300 nm. Of the portions of the polycrystalline silicon layer 22, the portion in the region corresponding to the pMOSFET formation region 50 is called the first region 55a, and the portion in the region corresponding to the nMOSFET formation region 60 is called the second region 55b. Next, a well-known method of the prior art is used to form a silicon oxide film 23 on the above polycrystalline silicon layer 22, preferably to a film thickness in the range 30 nm to 50 nm (FIG. 1A). By providing a silicon oxide film 23, the occurrence of channeling of impurities, contamination and similar during impurity implantation in later processes may be prevented; however, a silicon oxide film 23 need not be provided.

Figure 1B:
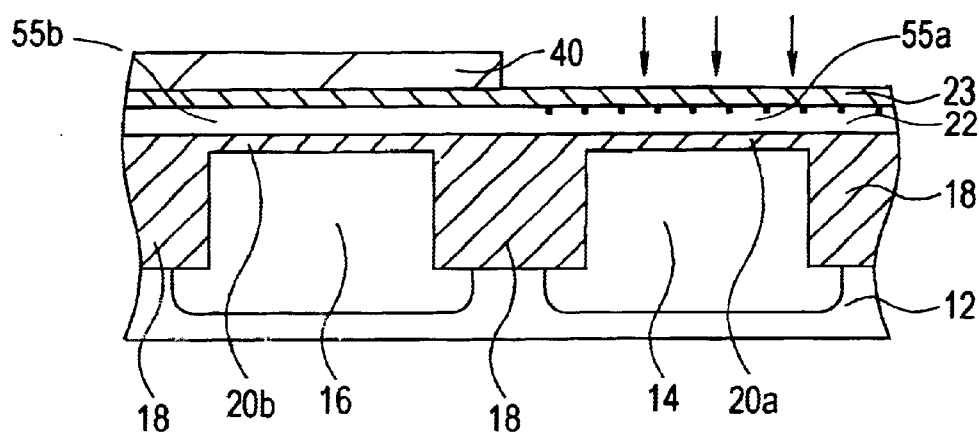

Thereafter, photolithography is used to form a resist pattern 40 in the upper portion of the silicon oxide film 23 in the nMOSFET formation region 60. And, using this resist pattern 40 as a mask, ion implantation of impurities of the first conduction type into the first region 55a of the pMOSFET formation region 50 is performed. In this example, boron (B) is used as the impurity of the first conduction type; this boron is implanted from above the silicon oxide film 23 at, for example, an ion energy of 10 keV and dose of $5 \times 10^{15}$ cm$^{-2}$. (FIG. 1B)

Figure 1C:
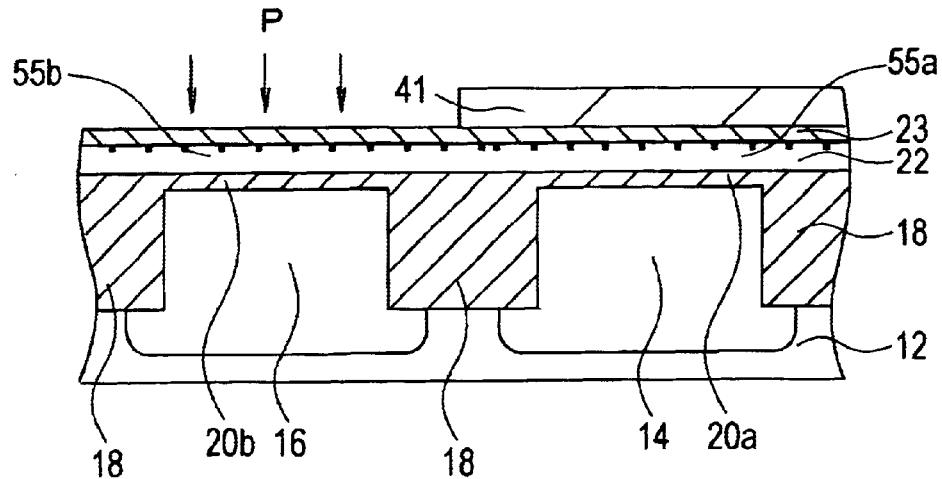

Then, after removing the resist pattern 40, photolithography is used to form a new resist pattern 41 in the region covering the pMOSFET formation region 50. And, using this resist pattern 41 as a mask, ion implantation of impurities of the second conduction type into the second region 55b of the nMOSFET formation region 60 is performed. In this configuration example, phosphorus (P) is used as the impurities of the second conduction type; this phosphorus is ion-implanted from above the silicon oxide film 23 at, for example, an ion energy of 50 keV and a dose of $5 \times 10^{15}$ cm$^{-2}$. (FIG. 1C)

Next, in the process to form an impurity thermal diffusion prevention layer, an impurity thermal diffusion prevention layer which prevents diffusion of impurities implanted into the polycrystalline silicon layer 22 is formed on top of polycrystalline silicon layer 22. That is, in this configuration example, an impurity thermal diffusion prevention layer is provided in order to effectively prevent the penetration of impurities into the first and second impurity diffusion layers (22a, 22b) during patterning of the first and second gate electrodes (32a, 32b) in later processes. The impurity thermal diffusion prevention layer of this invention is provided on the polycrystalline silicon layer 22 extending into the pMOSFET formation region 50 and nMOSFET formation region 60, or, at least, on the polycrystalline silicon layer 22 formed in the pMOSFET formation region 50.

Figure 2A:
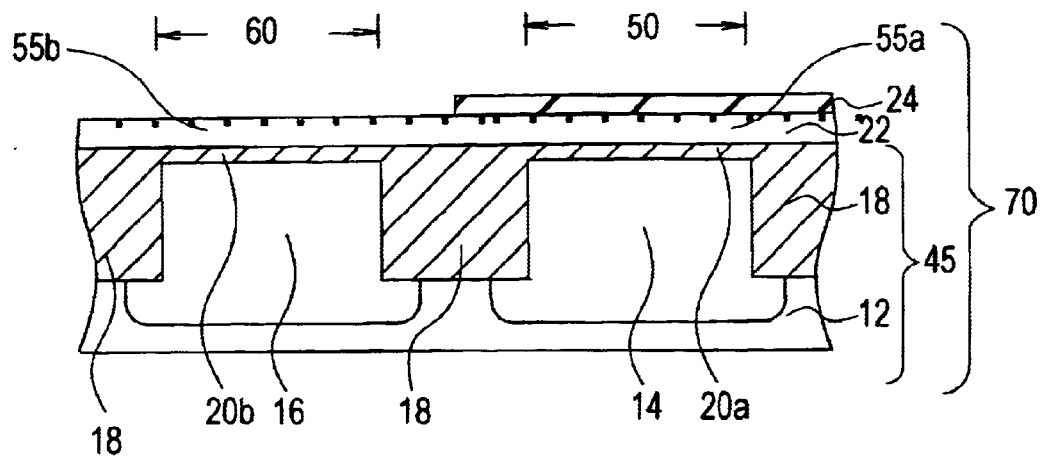
FIG. 2A, FIG. 2B and FIG. 2C are cross-sectional views which explain processes in the manufacture of the semiconductor device of the first aspect of this invention.

Specifically, in this aspect, after removing the resist pattern 41 and silicon oxide film 23, a carbon-containing polycrystalline silicon layer 24 is fined selectively by epitaxial growth, to a film thickness in the range 10 nm to 30 nm, as an impurity thermal diffusion prevention layer solely on the polycrystalline silicon layer 22 of the pMOSFET formation region 50. In this way, a layered structure 70 is obtained which comprises a base layer 45, polycrystalline silicon layer 22, and carbon-containing polycrystalline silicon layer 24 (FIG. 2A). At this time, the selective growth is for example performed at a deposition temperature of 650° C. and a pressure of 15 Torr, passing hydrogen ($H_2$) as the carrier gas, and dichlorosilane ($SiH_2Cl_2$) gas at 200 SCCM and methyl silane ($SiH_2CH_3$) gas at 300 SCCM as the source material gases.

As a result, a carbon-containing polycrystalline silicon layer 24 containing, for example, carbon at a concentration of approximately 0.5 atomic percent, is formed on the polycrystalline silicon layer 22 of the pMOSFET formation region 50. The crystal orientations in this polycrystalline silicon layer 22 are irregular; but even if roughness or crystal grain boundaries occur at the surface of the carbon-containing polycrystalline silicon layer 24, the carbon-containing polycrystalline silicon layer 24 is formed to a film thickness sufficiently thin that, in practice, the roughness or crystal grain boundaries have no adverse effects on the MOSFET. Further, because the crystal growth rate under the above-described conditions is approximately 2 nm/minute, a film of the desired thickness can be obtained without encountering problems in control of the film thickness. Further, the carbon concentration (atomic percent) in the carbon-containing polycrystalline silicon layer 24 can be increased by increasing the flow rate of the methyl silane gas, so that the carbon concentration can be set arbitrarily in accordance with the purpose and design.

As the method of deposition of the carbon-containing polycrystalline silicon layer 24, instead of the above-described epitaxial growth method, chemical vapor deposition (CVD) can for example be used. In this case, by passing hydrogen ($H_2$) as the carrier gas, and silane ($SiH_4$) gas at 200 SCCM and methyl silane ($SiH_3CH_3$) gas at 300 SCCM as the source material gases, at a deposition temperature of 650° C. and pressure of 15 Torr, the carbon-containing polycrystalline silicon layer 24 can be deposited.

Next, in the compound layer formation process, a high-melting-point metal layer or high-melting-point metal silicide layer is formed so as to cover the layered structure 70, that is, so as to cover the polycrystalline silicon layer 22 extending from the first region 55a to the second region 55b. A compound layer 25 is thus formed, comprising a polycrystalline silicon layer 22 in which are separately implanted p-type and n-type impurities, an impurity thermal diffusion prevention layer 24, and a high-melting-point metal layer or high-melting-point metal silicide layer.

Figure 2B:
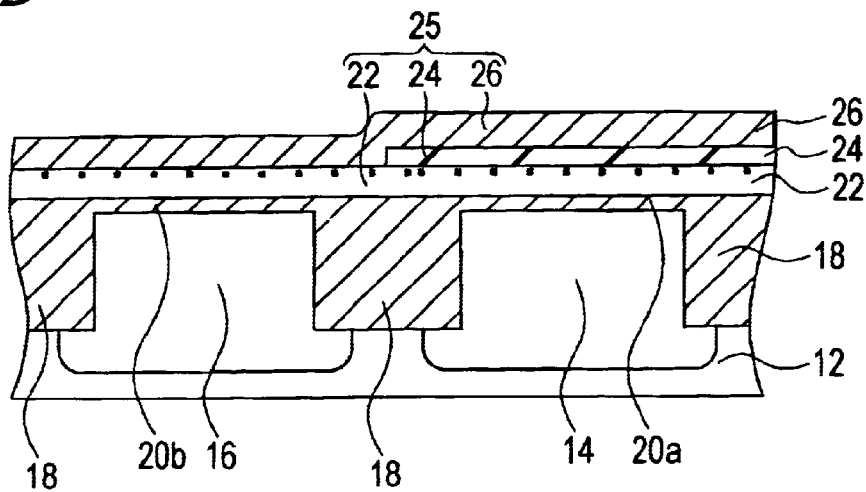

Specifically, a well-known method of the prior art is used to form a high-melting-point metal layer or high-melting-point metal silicide layer which is a metallic conductive layer on the layered structure 70; for example, a tungsten silicide $WSi_x$ layer 26 is formed to a film thickness in the range 50 nm to 200 nm, to obtain a compound layer 25 (FIG. 2B). The metallic conductive layer formed on the layered structure 70 is provided in order to reduce the resistance of the first and second gate electrodes. Hence as the metallic conductive layer used in this invention, in addition to the tungsten silicide layer or other high-melting-point metal silicide layer used as an example in this aspect, a tungsten layer or other high-melting-point metal layer can be used.

Next, in the diffusion layer formation process, heat treatment of the compound layer 25 is performed. By means of this heat treatment, the first and second impurities (p-type and n-type impurities) which were respectively implanted into the first region 55a and second region 55b are caused to diffuse in the polycrystalline silicon layer 22, to form the first and second impurity diffusion layers.

Specifically, the compound layer 25 is annealed for a time in the range 10 seconds to 30 seconds at a heat treatment temperature in the range of, for example, 900° C. to 1100° C. In this way, p-type impurities are caused to diffuse in the polycrystalline silicon layer 22 which is the first region 55a of the pMOSFET formation region 50, and n-type impurities are caused to diffuse in the polycrystalline silicon layer 22 which is the second region 55b of the nMOSFET formation region 60. Also, the first and second regions (55a, 55b) are activated. As a result, the p-type polycrystalline silicon layer 22a which is the first impurity diffusion layer, and the n-type polycrystalline silicon layer 22b which is the second impurity diffusion layer, are each formed. And, a layered structure 27 is obtained comprising a p-type polycrystalline silicon layer 22a, n-type polycrystalline silicon layer 22b, carbon-containing polycrystalline silicon layer 24, and tungsten silicide layer 26 (FIG. 2C).

Next, in the electrode formation process, the layered structure comprising the first and second impurity diffusion layers (22a, 22b), the layered structure 27 including the impurity thermal diffusion prevention layer 24 and the tungsten silicide layer 26 is patterned to form the first and second gate electrodes.

Figure 2C:
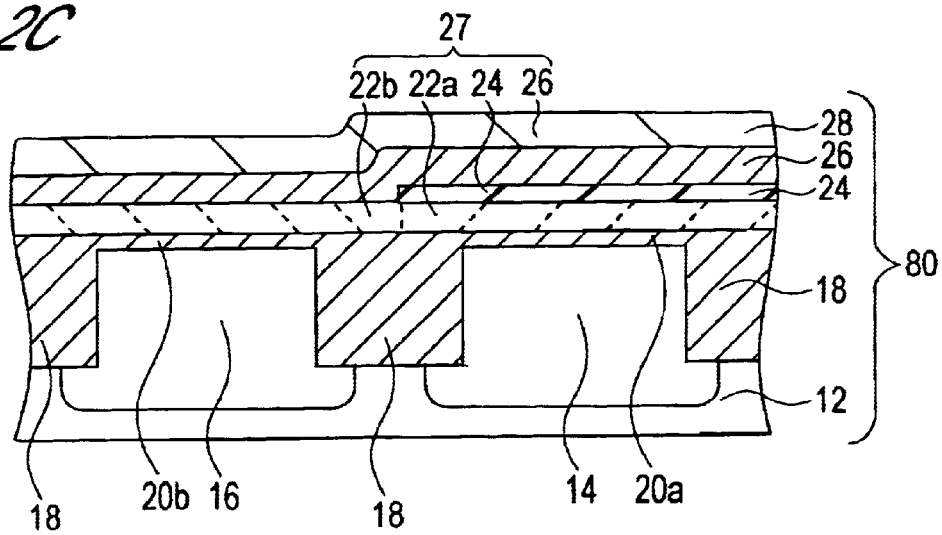

Specifically, a well-known method of the prior art is first used to form an offset oxide film 28 of film thickness 150 nm on the tungsten silicide layer 26, to obtain the structure 80 (see FIG. 2C). In this configuration example, the structure 80 comprises the base layer 45; activated p-type polycrystalline silicon layer 22a; activated n-type polycrystalline silicon layer 22b; activated carbon-containing polycrystalline silicon layer 24; tungsten silicide layer 26; and offset oxide film 28.

Next, after forming two island-shape protruding portions (protrusions) isolated by a prescribed from the structure 80, conventional methods are used to form the first gate electrode and second gate electrode with side walls.

More specifically, photolithography is used to form a resist pattern (not shown) covering the second layered structure surface layer corresponding to the first gate electrode 32a and second gate electrode 32b in the structure 80. Then, this resist pattern is used as a mask to perform anisotropic etching of the regions of the exposed structure 80. Following this, p-type impurities are implanted into the silicon substrate 12 at positions on both sides of the protrusion of the structure 80 remaining in the pMOSFET formation region 50, to form the p-type LDD area 15a. Also, n-type impurities are implanted into the silicon substrate 12 at positions on both sides of the protrusion of the structure 80 remaining in the nMOSFET formation region 60, to form the n-type LDD area 15b. Following this, side walls 30a and 30b of silicon oxide film are formed from the sides of the protrusions in each of the remaining layered structures are formed by, for example, an etch-back method. Then, p-type impurities are implanted into the surface layer portion of the silicon substrate 12 of the pMOSFET formation region 50, to form the p-type source/drain area 17a. Also, n-type impurities are implanted into the surface layer portion of the silicon substrate 12 of the nMOSFET formation region 60, to form the n-type source/drain area 17b.

Following this, for example, rapid thermal annealing over ten seconds at a heat treatment temperature of 1000° C. is performed, and impurities are activated. In this way, a CMOSFET 10 in which are provided the pMOSFET 11a and the nMOSFET 11b is completed (FIG. 3).

The pMOSFET 11a comprises a p-type polycrystalline silicon layer 22a; p-type carbon-containing polycrystalline silicon layer 24; tungsten silicide layer 26a, which is the first metallic conduction layer; offset oxide film 28a; and first gate electrode 32a having side walls 30a. The nMOSFET 11b comprises an n-type polycrystalline silicon layer 22b; tungsten silicide (WSi$_x$) layer 26b, which is the second metallic conduction layer; offset oxide film 28b; and second gate electrode 32b having side walls (silicon oxide film).

As is clear from the above, in this aspect a pMOSFET 11a is fabricated, and a carbon-containing polycrystalline silicon layer 24 is formed between the polycrystalline silicon layer 22a of the gate electrode 32a and the tungsten silicide layer 26a.

During the annealing process to activate the polycrystalline silicon layer 22, carbon in the carbon-containing polycrystalline silicon layer 24 is inferred to fill holes (in actuality, even in single-crystal silicon, existing in concentrations of $10^{18}$ to $10^{19}$ cm$^{-3}$), which are one type of lattice defect inherent in polycrystalline silicon. As a result, it is thought, the carbon suppresses the movement of p-type impurities through these holes and into the nMOSFET formation region 60 through the tungsten silicide layer 26.

That is, the carbon-containing polycrystalline silicon layer 24 in this configuration example functions as a stopper layer to suppress the interdiffusion of impurities. In this configuration example, the diffusion rate of p-type impurities is reduced to approximately 1/10 the case in which a carbon-containing polycrystalline silicon layer 24 is not provided (hereafter called the normal case); hence by setting the carbon concentration (atomic percent) such that the diffusion rate of p-type impurities is approximately 1/10 that of the normal case, a satisfactory result can be expected.

Hence in this aspect, by reducing impurity diffusion (interdiffusion), fluctuations in the threshold voltage ($V_{th}$) can be suppressed, and so a highly reliable CMOSFET capable of high integration levels can be obtained.

Second Embodiment

Figure 4A:
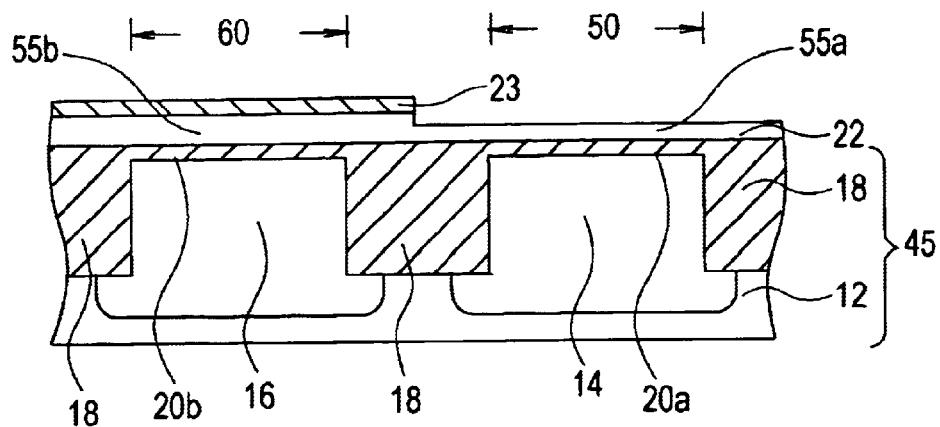
FIG. 4A, FIG. 4B and FIG. 4C are cross-sectional views which explain processes in the manufacture of the semiconductor device of the second aspect of this invention.
Figure 4B:
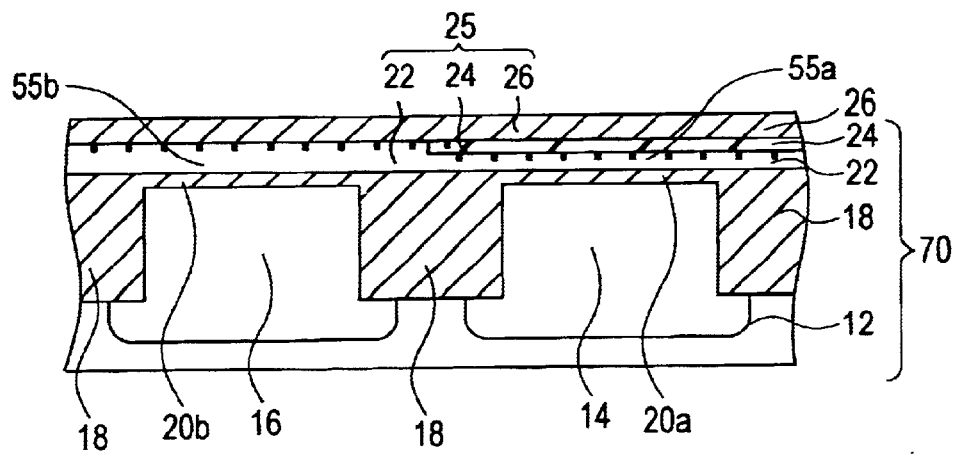

The semiconductor device and manufacturing method of the second aspect of this invention are explained below, referring to FIGS. 4A through 4C and to FIG. 5.

Figure 5:
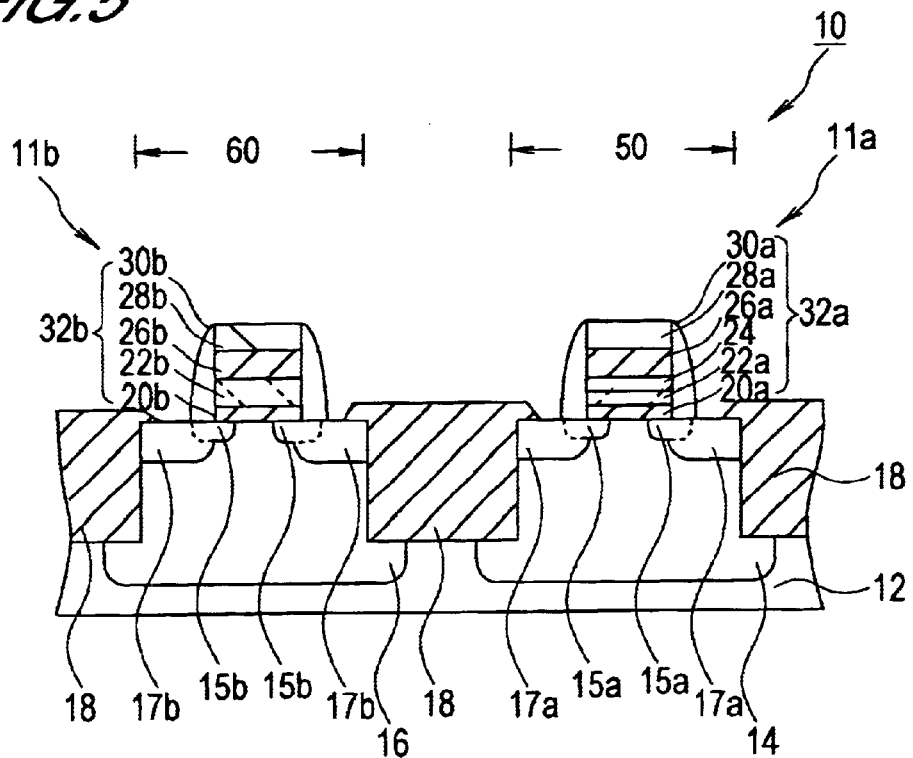
FIG. 5 is a cross-sectional view of the semiconductor device of the second and fifth aspects of this invention.

FIG. 5 is a cross-sectional view of the semiconductor device of this aspect. As shown in FIG. 5, this aspect differs from the first aspect in that the first gate electrode 32a comprised by the pMOSFET 11a and the second gate electrode 32b comprised by the nMOSFET 11b in the CMOSFET 10 are provided such that the heights of both are effectively equal.

More specifically, when fabricating the above CMOSFET 10 in this aspect, the following processes are performed prior to performing impurity implantation. This differs from the case of the first aspect. The polycrystalline silicon layer 22 in the region in which the carbon-containing polycrystalline silicon layer 24 is provided in the pMOSFET formation region 50 is etched such that the polycrystalline silicon layer 22 is made thinner by a depth corresponding to the layer thickness from the surface of the layer 22 to the carbon-containing polycrystalline silicon layer 24. In the process to form the impurity thermal diffusion prevention layer, the carbon-containing silicon layer 24 is formed by embedding in the region in which a portion of the polycrystalline silicon layer 22 has been removed. Below, this difference with the first aspect is mainly explained, and explanations which are redundant with the first aspect are omitted. In the figures, constituent components which are the same as in the first aspect are assigned the same symbols, and explanations are omitted (and similarly for subsequent aspects).

First, by means of a method similar to that of the first aspect, a polycrystalline silicon layer 22 and silicon oxide film 23 are formed on a base layer 45 (FIG. 1A). Then, photolithography is used to form a resist pattern (not shown) covering the nMOSFET formation region 60. Using this resist pattern as a mask, the silicon oxide film 23 exposed in the pMOSFET formation region 50 is etched and removed. Then, the silicon oxide film 23 remaining in the nMOSFET formation region 60 is used as a mask to remove the polycrystalline silicon layer 22 exposed in the pMOSFET formation region 50, from the surface layer to a depth in the range 10 nm to 30 nm (FIG. 4A). At this time, the etching amount (depth) is adjusted so as to be equal to the film thickness of the carbon-containing polycrystalline silicon layer 24 formed in a later process. In the above-described removal of the polycrystalline silicon layer 22, anisotropic etching (dry etching) or wet etching can be used. When using wet etching, for example, a mixture of hydrofluoric acid and nitric acid can be used.

Next, a method similar to that of the first aspect is used for impurity implantation, and then in the impurity thermal diffusion prevention layer formation process, a carbon-containing polycrystalline silicon layer 24 is selectively grown to a film thickness in the range 10 nm to 30 nm on the polycrystalline silicon layer 22 of the pMOSFET formation region 50, after which the silicon oxide film 23 is removed. At this time, the carbon-containing polycrystalline silicon layer 24 formed in the pMOSFET formation region 50 is formed to a thickness such that an effectively flat face is formed with the surface of the polycrystalline silicon layer 55b of the nMOSFET formation region 60. In this way, a layered structure 70 with an effectively flat surface, comprising a base layer 45, polycrystalline silicon layer 22, and carbon-containing polycrystalline silicon layer 24, is obtained. Then, by forming a tungsten silicide layer 26 to a film thickness in the range 50 nm to 200 nm, the compound layer 25 is formed (FIG. 4B).

Figure 4C:
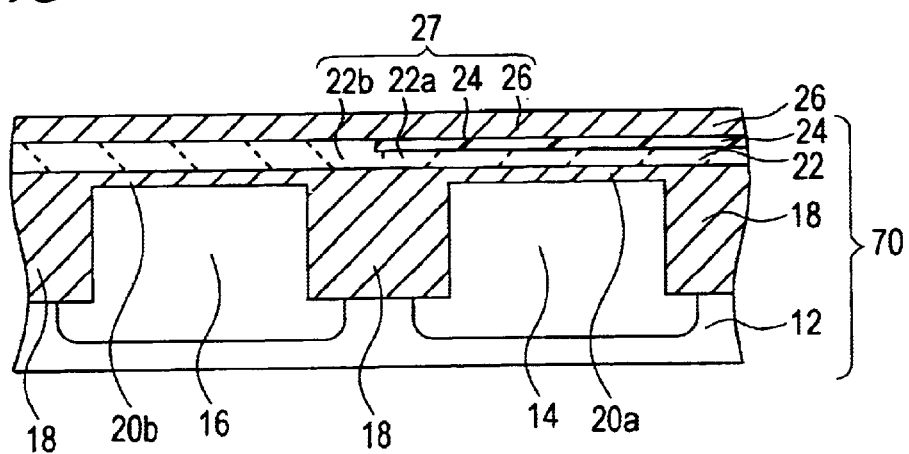

As a result, the surface of the layered structure 27 is also effectively flat (FIG. 4C). The layered structure 27 comprises the first and second impurity diffusion layers (22a, 22b), obtained after the diffusion layer formation process, as well as the carbon-containing polycrystalline silicon layer 24, and the tungsten silicide layer 26.

Then, by performing the processes from the diffusion layer formation process to the electrode formation process, similarly to the processes from the diffusion layer formation process to the electrode formation process of the first aspect, the CMOSFET 10 is completed (FIG. 5).

As is clear from the above explanation, the CMOSFET 10 fabricated in this aspect affords advantageous results similar to those of the first aspect.

Also, in this aspect, a prescribed region of the polycrystalline silicon layer is provided by etching and removal of material in advance, as the region for crystal growth of the carbon-containing polycrystalline silicon layer 24.

As a result, when forming the first and second gate electrodes (32a, 32b) in subsequent processes, the step between the surface of the polycrystalline silicon layer 22 in the nMOSFET formation region 60 and the surface of the carbon-containing polycrystalline silicon layer 24 in the pMOSFET formation region 50, on which the tungsten silicide layer 26 is formed, can effectively be eliminated.

Compared with the first aspect, in these subsequent manufacturing processes there is no need to take into consideration flattening of the step, so that shaping of the first and second gate electrodes (32a, 32b) is easy compared with the first aspect.

Third Embodiment

Figure 6:
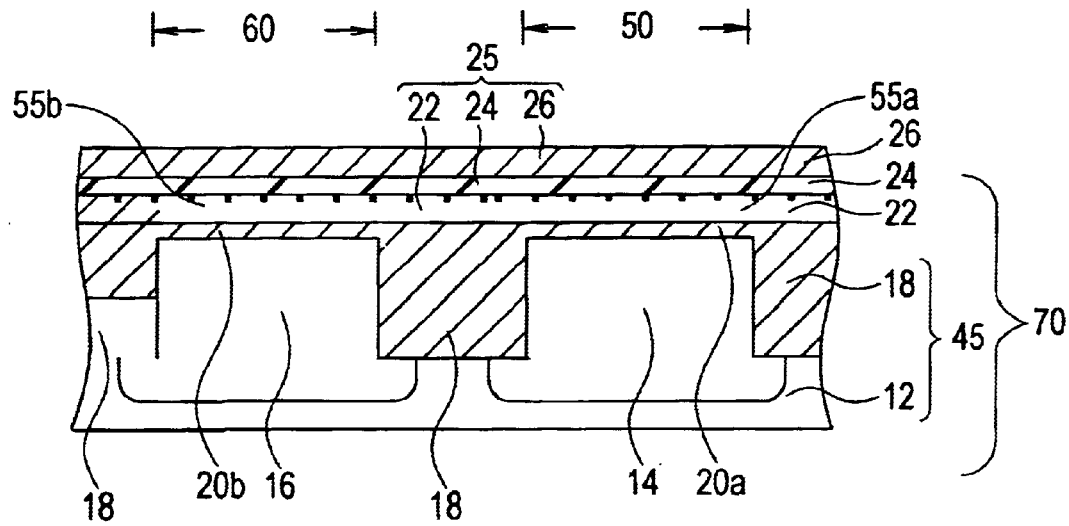
FIG. 6 is a cross-sectional view which explains a process in the manufacture of the semiconductor device of the third aspect of this invention.

The semiconductor device and manufacturing method of the third aspect of this invention are explained below, referring to FIG. 6 and FIG. 7.

Figure 7:
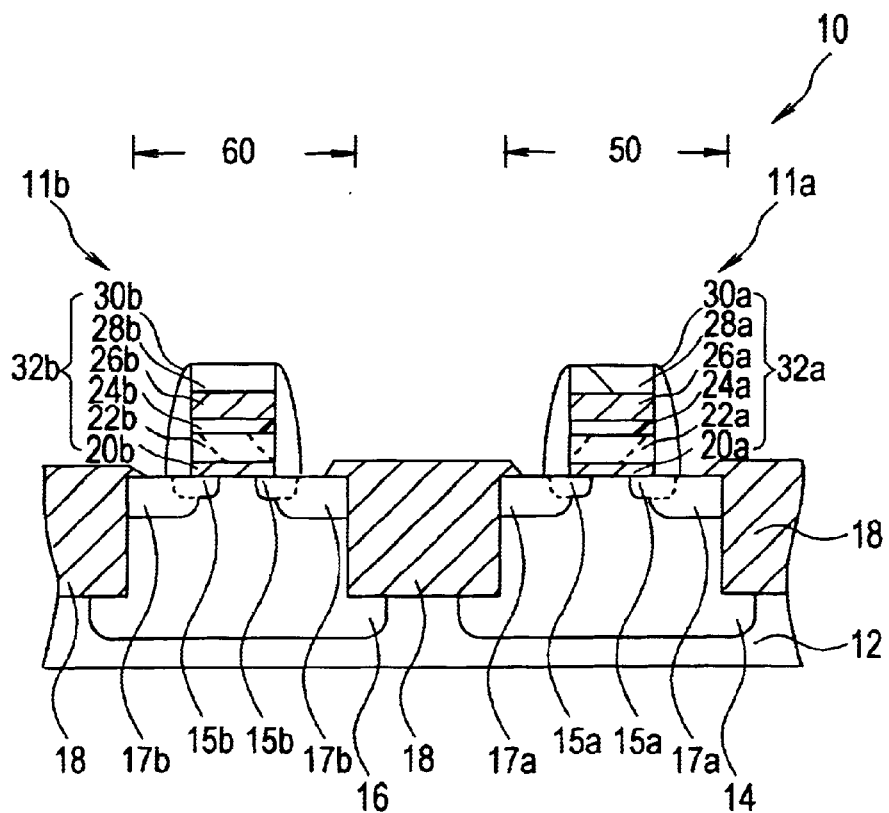
FIG. 7 is a cross-sectional view of the semiconductor device of the third and sixth aspects of this invention.

FIG. 7 is a cross-sectional view of the semiconductor device 10 of this aspect. As shown in FIG. 7, this aspect differs from the first aspect in that carbon-containing polycrystalline silicon layers (24a, 24b) are provided between the polycrystalline silicon layers (22a, 22b) and the tungsten silicide layers (26a, 26b) in both the first gate electrode 32a and in the second gate electrode 32b.

More specifically, this aspect differs from the first aspect in that, when fabricating the above CMOSFET 10, in the impurity thermal diffusion prevention layer formation process a carbon-containing polycrystalline silicon layer 24 is formed on the polycrystalline silicon layer 22 in both the pMOSFET formation region 50, and in the nMOSFET formation region 60. That is, in the first aspect, the carbon-containing polycrystalline silicon layer 24 is formed on the polycrystalline silicon layer 22 in the nMOSFET formation region 60.

First, the impurity implantation process is performed, similarly to the impurity implantation process of the first aspect (FIG. 1C).

Then, in the impurity thermal diffusion prevention layer formation process of this aspect, a method similar to that of the first aspect is used for selective epitaxial growth of a carbon-containing polycrystalline silicon layer 24 to a film thickness in the range 10 nm to 30 nm on the polycrystalline silicon layer 22 of the pMOSFET formation region 50 and nMOSFET formation region 60, as an impurity thermal diffusion prevention layer. In this way, a layered structure 70 is obtained comprising a base layer 45, polycrystalline silicon layer 22, and carbon-containing polycrystalline silicon layer 24 (FIG. 6).

Then, similarly to the first aspect, the processes from the compound layer formation process to the electrode formation process are performed, to complete the CMOSFET 10 (FIG. 7).

As is clear from the above explanation, the CMOSFET 10 fabricated in this aspect affords advantageous results similar to those of the first aspect.

In this aspect, as a result of providing a carbon-containing polycrystalline silicon layer 24 in the nMOSFET formation region 60 also, it is possible that the effect of suppression of interdiffusion arising during the annealing process to activate the polycrystalline silicon layer 22, for example, may be degraded. However, there is no need to selectively form a carbon-containing polycrystalline silicon layer 24 only in the pMOSFET formation region 50, as in the first aspect. Hence the number of processes can be reduced compared with the first aspect.

Fourth Embodiment

The semiconductor device and manufacturing method of the fourth aspect of this invention are explained below, referring to FIG. 3 and to FIGS. 8A through 9C.

The dual-gate CMOSFET 10 which is the semiconductor device of this aspect has a configuration similar to that shown in FIG. 3. However, this aspect differs from the first aspect in that, in fabricating the above CMOSFET 10, formation of the carbon-containing polycrystalline silicon layer 24 (impurity thermal diffusion prevention layer formation process) in a prescribed region on the polycrystalline silicon layer 22 is performed prior to implantation of impurities of the first and second conduction types (impurity implantation process) into the polycrystalline silicon layers of the pMOSFET formation region 50 and nMOSFET formation region 60.

The method of CMOSFET fabrication of the fourth aspect is explained below.

First, in the impurity thermal diffusion prevention layer formation process, an impurity thermal diffusion prevention layer 24 which prevents diffusion of impurities implanted into the polycrystalline silicon layer 22 is provided on the polycrystalline silicon layer 22, to form the layered structure 70.

Figure 8A:
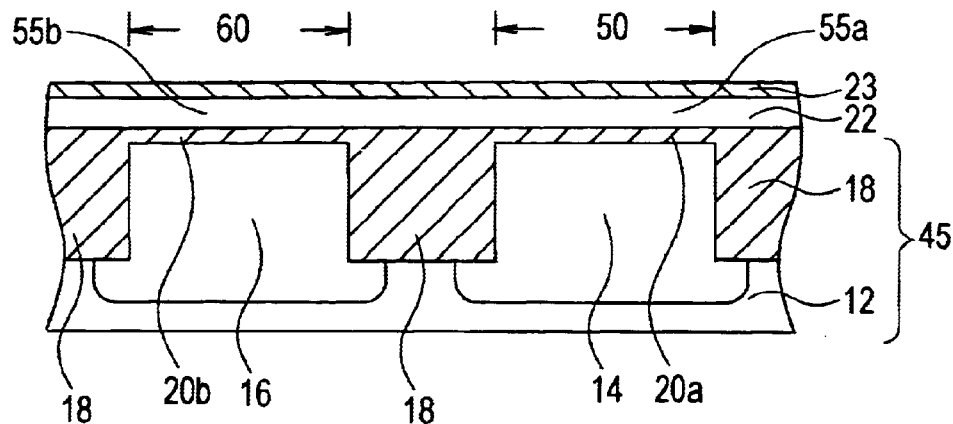
FIG. 8A, FIG. 8B and FIG. 8C are cross-sectional views which explain processes in the manufacture of the semiconductor device of the fourth aspect of this invention.

Specifically, first a method similar to that of the first aspect is used to form, in sequence, a polycrystalline silicon layer 22 and silicon oxide film 23 on the base layer 45 (FIG. 8A).

Figure 8B:
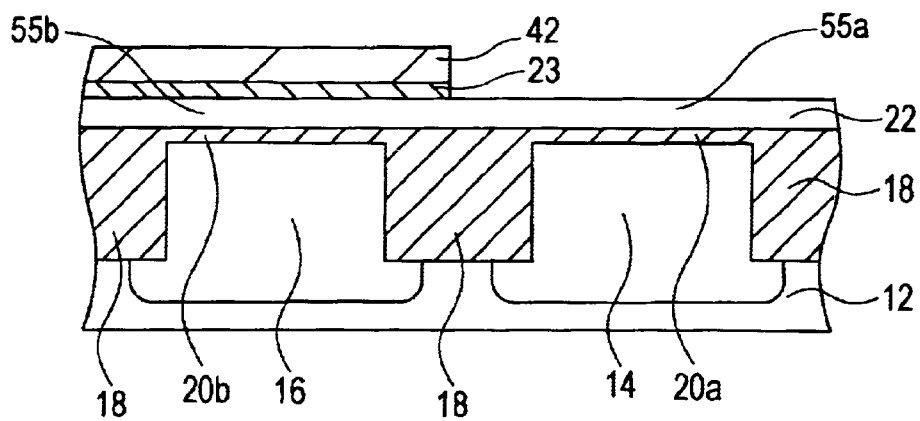

Then, photolithography is used to form a resist pattern 42 in the upper portion of the silicon oxide film 23 of the nMOSFET formation region 60. Next, using this resist pattern 42 as a mask, the uncovered portion of the silicon oxide film 23 exposed in the pMOSFET formation region 50 is etched and removed (FIG. 8B).

Figure 8C:
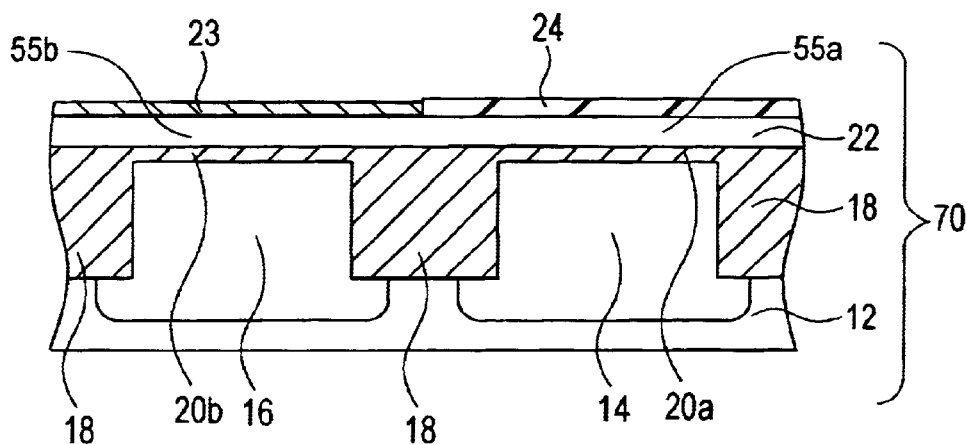

Then, a method similar to that of the first aspect is used to perform selective epitaxial growth of a carbon-containing polycrystalline silicon layer 24 to a film thickness in the range 10 nm to 30 nm on the exposed upper portion of the polycrystalline silicon layer 22 of the pMOSFET formation region 50. In this way, a carbon-containing polycrystalline silicon layer 24 containing carbon at a concentration of, for example, approximately 0.5 atomic percent, is formed on the polycrystalline silicon layer 22 of the pMOSFET formation region 50. Thereafter, by removing the resist pattern 42, the layered structure 70 is obtained (FIG. 8C). In this configuration example, the layered structure 70 comprises the base layer 45, polycrystalline silicon layer 22, silicon oxide film 23, and carbon-containing polycrystalline silicon layer 24.

Next, in the impurity implantation process, impurities of the first and second conduction types are respectively implanted from above this layered structure 70 into the regions planned for formation of the first and second gate electrodes in the surface layer of the layered structure 70.

Figure 9A:
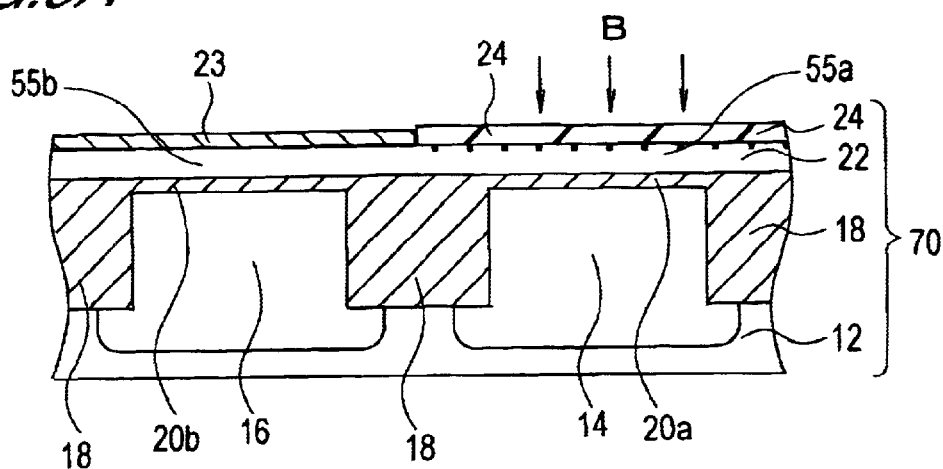
FIG. 9A, FIG. 9B and FIG. 9C are cross-sectional views which explain processes in the manufacture of the semiconductor device of the fourth aspect of this invention.

Specifically, the region of the polycrystalline silicon layer 22 and the carbon-containing polycrystalline silicon layer 24 in, at least, the region planned for formation of the first gate electrode of the first conduction type (first gate electrode 32a) (here taken to include the entirety of the pMOSFET formation region 50), is doped from above the layered structure 70 with boron (B), which is an impurity of the first conduction type. This doping is achieved by, for example, ion implantation at an ion energy of 10 keV and dose of $5 \times 10^{15}$ cm$^{-2}$ (FIG. 9A). Because grain boundaries at the interface between the polycrystalline silicon layer 22 and the carbon-containing polycrystalline silicon layer 24 are mismatched and the two layers have different lattice orientations, the boron does not penetrate into the silicon substrate 12 during ion implantation.

Figure 9B:
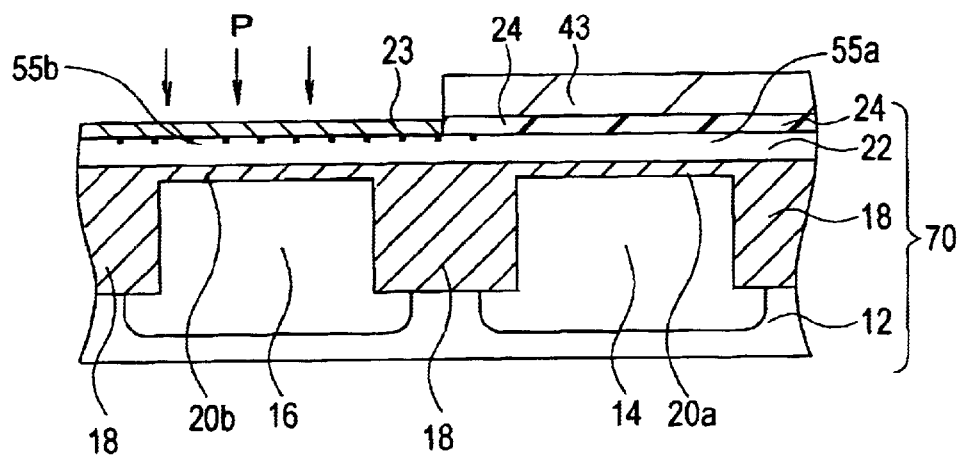

Then, photolithography is used to form a resist pattern 43 covering the pMOSFET formation region 50. Next, this resist pattern 43 is used as a mask to dope, at least, the region of the polycrystalline silicon layer 22 within the region planned for formation of the second gate electrode (second gate electrode 32b) of the second conduction type in the nMOSFET formation region 60 (here, the entirety of the nMOSFET formation region 60) with phosphorus (P), which is an impurity of the second conduction type, from above the layered structure 70. This doping is achieved by, for example, ion implantation at an ion energy of 50 keV and dose of $5 \times 10^{15}$ cm$^{-2}$ (FIG. 9B).

Next, in the diffusion layer formation process, heat treatment of the layered structure 70 is performed, the first and second impurities implanted into the surface layer of the layered structure 70 are diffused in the polycrystalline silicon layer, and the first and second impurity diffusion layers are formed.

Specifically, the layered structure 70 is heated (annealed), for example, for a time ranging from 10 seconds to 30 seconds, at an annealing temperature in the range 900° C. to 1100° C. In this way, p-type impurities are diffused in the polycrystalline silicon layer 22 which is the first region 55a of the pMOSFET formation region 50, and n-type impurities are diffused in the polycrystalline silicon layer 22 which is the second region 55b of the nMOSFET formation region 60, so that a p-type polycrystalline silicon layer 22a and an n-type polycrystalline silicon layer 22b are formed.

Next, in the process to form a high-melting-point metal layer or high-melting-point metal silicide layer, a high-melting-point metal layer or high-melting-point metal silicide layer is formed so as to cover the polycrystalline silicon layer 22 extending from the first region 55a to the second region 55b.

Specifically, a well-known method of the prior art is used to form a tungsten silicide (WSi$_x$) layer 26, for example, to a film thickness of 50 nm to 200 nm as a high-melting-point metal layer or high-melting-point metal silicide layer, which is a metallic conducting layer, on the layered structure 70.

Next, in the electrode formation process, the layers comprising the first and second impurity diffusion layers (22a, 22b) and the impurity thermal diffusion prevention layer 24 are patterned to form the first and second gate electrodes.

Figure 9C:
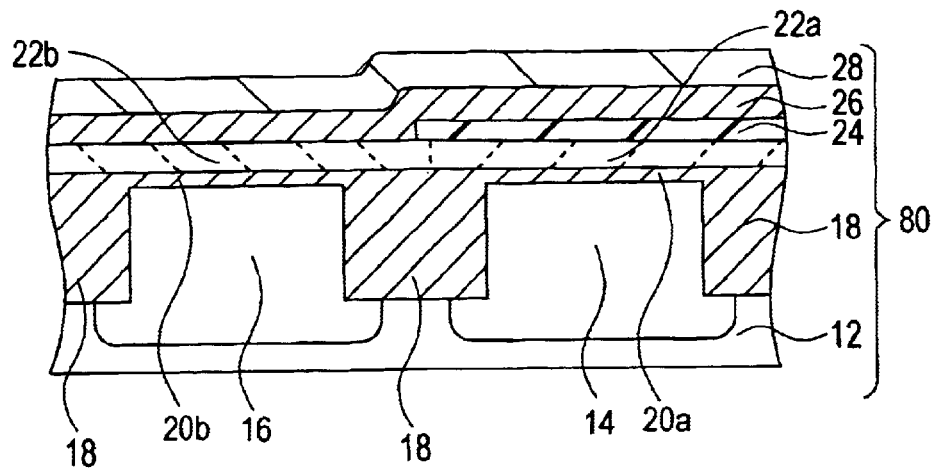

Specifically, first a method similar to that of the first aspect is used to form an offset oxide film to a film thickness of 150 nm on the layered structure 70 on which the tungsten silicide layer 26 has been formed following the process to form a high-melting-point metal layer or high-melting-point metal silicide layer, to obtain the layered structure 80 (FIG. 9C).

Next, a method similar to that of the first aspect is used to provide a pMOSFET 11a comprising a first gate electrode 32a having a p-type polycrystalline silicon layer 22a; p-type carbon-containing polycrystalline silicon layer 24; tungsten silicide layer 26a which is a first metallic conduction layer; offset oxide film 28a; and side walls 30a.

Also, an nMOSFET 11b is provided comprising a second gate electrode 32b, having an n-type polycrystalline silicon layer 22b; tungsten silicide (WSi$_x$) layer 26b which is a second metallic conduction layer; offset oxide layer 28b; and side walls (silicon oxide film) 30b. By this means, a CMOSFET 10 in which are provided a pMOSFET 11a and an nMOSFET 11b is completed (FIG. 3)1

As is clear from the above explanation, this aspect affords advantageous results similar to those of the first aspect.

Fifth Embodiment

Figure 10A:
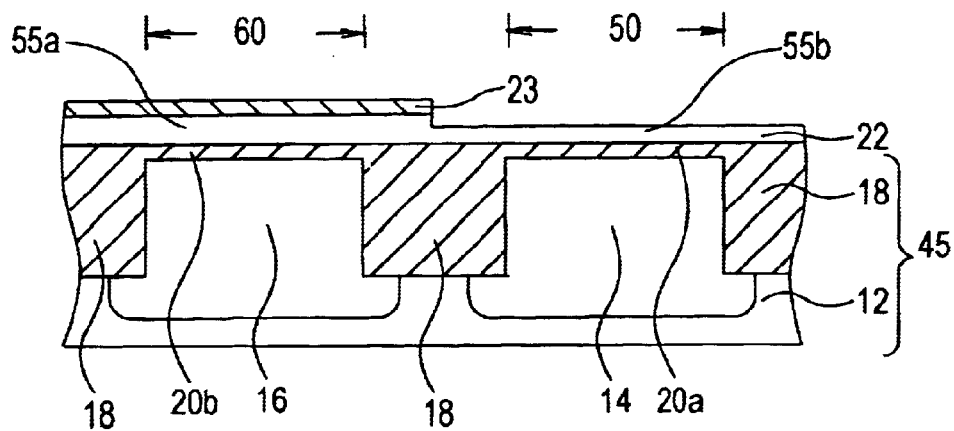
FIG. 10A, FIG. 10B and FIG. 10C are cross-sectional views which explain processes in the manufacture of the semiconductor device of the fifth aspect of this invention; and, FIG. 11A, FIG. 11B and FIG. 11C are cross-sectional views which explain processes in the manufacture of the semiconductor device of the sixth aspect of this invention.

The semiconductor device and manufacturing method of the fifth aspect are explained below, referring to FIG. 5 and to FIGS. 10A through 10C.

The dual-gate CMOSFET 10 which is the semiconductor device of this aspect has a configuration similar to that shown in FIG. 5. However, in the process of impurity thermal diffusion prevention layer formation among the processes to fabricate the above CMOSFET 10, this aspect differs from the fourth aspect in the following respect. After providing a depression in the polycrystalline silicon layer 22 equal to the thickness from the surface of this layer to the carbon-containing polycrystalline silicon layer 24, the carbon-containing polycrystalline silicon layer 24 is formed by embedding in the region of this depression formed in advance. The region in which the depression is provided in advance is that portion of the polycrystalline silicon layer 22 of the pMOSFET formation region 50 in which the carbon-containing polycrystalline silicon layer 24 is to be provided.

First, in the impurity thermal diffusion prevention layer formation process, a method similar to that of the fourth aspect is used to form, in sequence, the polycrystalline silicon layer 22 and silicon oxide film 23 on the base layer 45 (FIG. 8A), and then photolithography is used to form a resist pattern (not shown) covering the nMOSFET formation region 60. Then, using this resist pattern as a mask, the exposed silicon oxide film 23 in the pMOSFET formation region 50 is etched and removed. Next, using the remaining silicon oxide film 23 in the nMOSFET formation region 60 as a mask, a method similar to the method explained in the second aspect is used to remove the surface layer of the exposed polycrystalline silicon layer 22 in the pMOSFET formation region 50, to a depth in the range 10 nm to 30 nm (FIG. 10A).

Figure 10B:
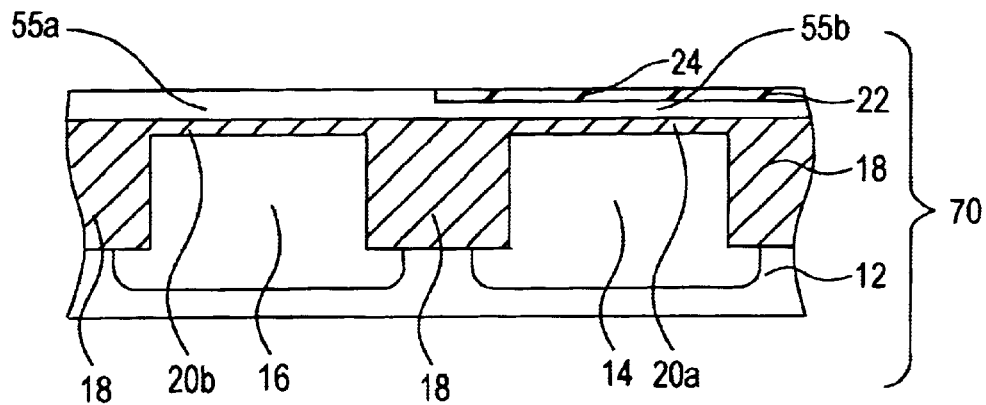
Figure 10C:
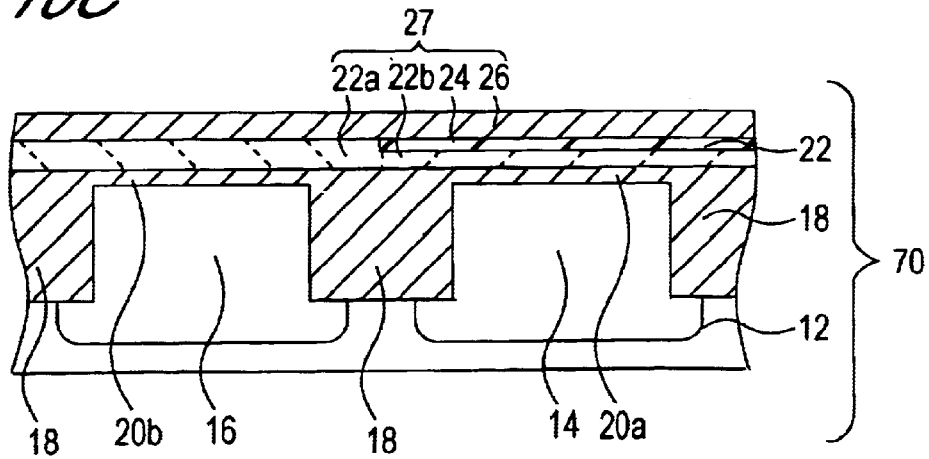

Next, in the impurity implantation process, after performing selective epitaxial growth of the carbon-containing polycrystalline silicon layer 24 to a film thickness of 10 nm to 30 nm on the polycrystalline silicon layer 22 of the pMOSFET formation region 50, the silicon oxide film 23 is removed, and a layered structure 70 with a substantially flat upper surface is obtained (FIG. 10B). The layered structure 70 of this configuration example comprises a base layer 45, polycrystalline silicon layer 22, and carbon-containing polycrystalline silicon layer 24.

Next, in the process to form a high-melting-point metal layer or high-melting-point metal silicide layer, a tungsten silicide WSi$_x$) layer 26, for example, is formed to a thickness of 50 nm to 200 nm on the layered structure 70 as a high-melting-point metal layer or high-melting-point metal silicide layer, which is a metallic conduction layer. By this means, the surface of the layered structure 27 obtained after the diffusion layer formation process, and comprising first and second impurity diffusion layers (22a, 22b) and a carbon-containing polycrystalline silicon layer 24, is effectively flat (FIG. 10C).

Then, similarly to the fourth aspect, the processes from the diffusion layer formation process to the electrode formation process are performed to complete the CMOSFET 10 (FIG. 5).

As is clear from the above explanation, the CMOSFET 10 fabricated in this aspect has advantageous results similar to those of the fourth aspect.

Moreover, when forming the first and second gate electrodes in this aspect, the step between the surface of the polycrystalline silicon layer 22 of the nMOSFET formation region 60 and the surface of the carbon-containing polycrystalline silicon layer 24 of the pMOSFET formation region 50, on which the tungsten silicide layer 26 is formed, can be effectively eliminated.

Hence compared with the fourth aspect, the considerations necessary to flatten the step can be relaxed, so that shaping of the first and second gate electrodes is easy.

Sixth Embodiment

Figure 11A:
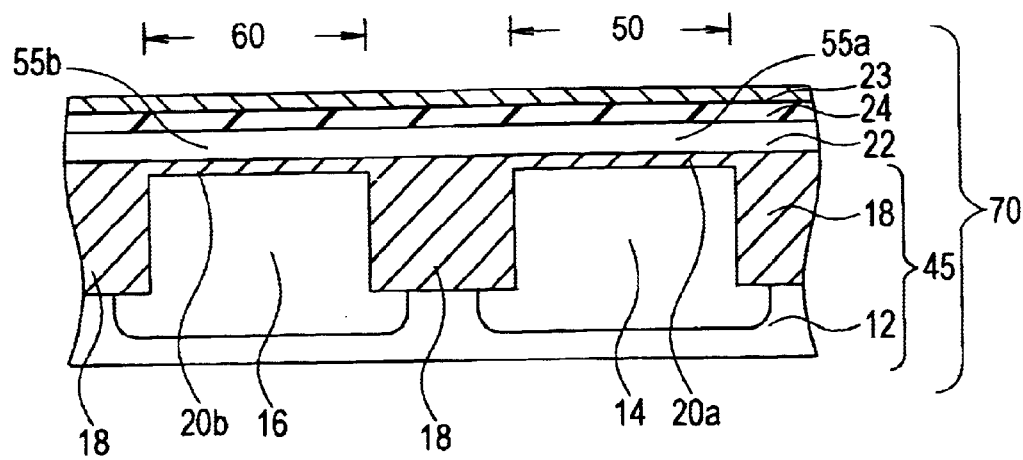
Figure 11B:
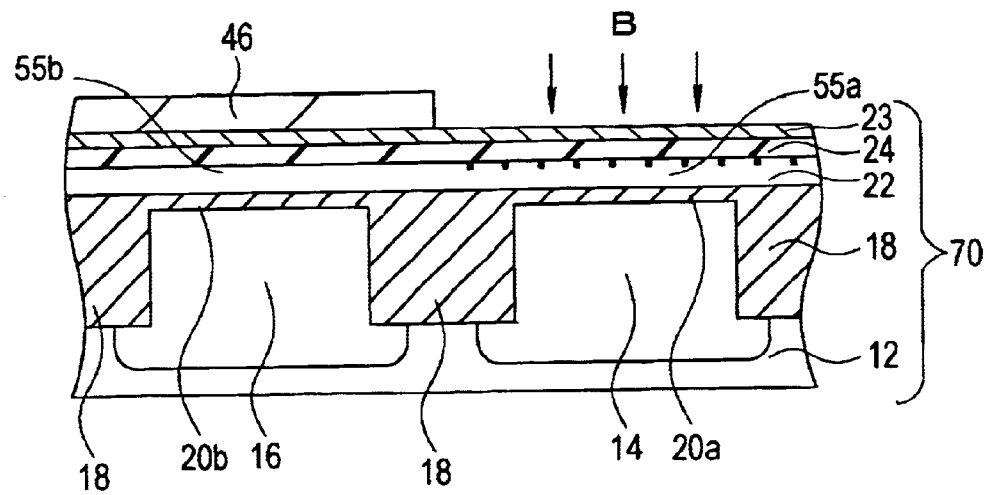
Figure 11C:
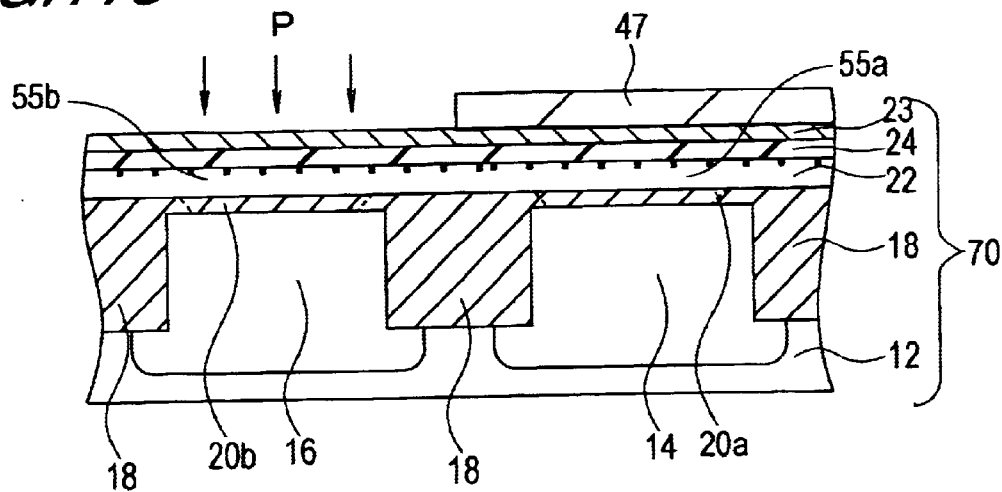

The semiconductor device and manufacturing method of the sixth aspect of this invention are explained below, referring to FIG. 7 and to FIGS. 11A through 11C.

The dual-gate CMOSFET 10 which is the semiconductor device of this aspect is configured similarly to that shown in FIG. 7. However, this aspect differs from the fourth aspect in that, when fabricating the above CMOSFET 10, the carbon-containing polycrystalline silicon layer 24 is formed on the polycrystalline silicon layer 22 of the pMOSFET formation region 50 and the nMOSFET formation region 60 in the impurity thermal diffusion prevention layer formation process.

First, in the process to form an impurity thermal diffusion prevention layer, a method similar to that of the fourth aspect is used to form the polycrystalline silicon layer 22 on the base layer 45. Next, in this aspect, after performing selective epitaxial growth of a carbon-containing polycrystalline silicon layer 24 to a film thickness of 10 nm to 30 nm on the polycrystalline silicon layer 22 of the pMOSFET formation region 50 and nMOSFET formation region 60 as an impurity thermal diffusion prevention layer, a silicon oxide film 23 is formed on this carbon-containing polycrystalline silicon layer 24, to obtain the layered structure 70 (FIG. 11A). In this configuration example, the layered structure 70 comprises the base layer 45, polycrystalline silicon layer 22, silicon oxide film 23, and carbon-containing polycrystalline silicon layer 24.

Then, in the impurity implantation process, photolithography is used to form a resist pattern 46 covering the nMOSFET formation region 60. Next, using this resist pattern 46 as a mask, the region of the polycrystalline silicon layer 22 and carbon-containing polycrystalline silicon layer 24 in, at least, the region planned for the first gate electrode 32a in the pMOSFET formation region 50 (here, the entirety of the pMOSFET formation region 50) is doped with boron, which is an impurity of the first conduction type, from above the layered structure 70. This doping is achieved by, for example, ion implantation at an ion energy of 10 keV and dose of $5 \times 10^{15}$ cm$^{-2}$ (FIG. 11B).

Next, photolithography is used to form a new resist pattern 47 covering the pMOSFET formation region 50. And, using this resist pattern 47 as a mask, the region of the polycrystalline silicon layer 22 in, at least, the region planned for the second gate electrode 32b in the nMOSFET formation region 60 (here, the entirety of the nMOSFET formation region 60) is doped with phosphorus (P), which is an impurity of the second conduction type, from above the layered structure 70. This doping is achieved by, for example, ion implantation at an ion energy of 50 keV and dose of $5 \times 10^{15}$ cm$^{-2}$ (FIG. 11C).

Then, similarly to the fourth aspect, the processes from the diffusion layer formation process to the electrode formation process are performed, to complete the CMOSFET 10 (FIG. 7).

As is clear from the above explanation, the CMOSFET 10 fabricated in this aspect affords advantageous results similar to those of the fourth aspect.

Moreover, in this aspect the carbon-containing polycrystalline silicon layer 24 is provided in the nMOSFET formation region 60 as well, so that there is no need to selectively form the carbon-containing polycrystalline silicon layer 24 solely in the pMOSFET formation region 50, as in the fourth aspect. Hence the number of processes can be reduced compared with the fourth aspect.

This invention is not limited to combinations of the above-described aspects. Thus this invention can be applied in an arbitrary suitable stage, and under a suitable combination of conditions.

For example, in each of the above-described aspects, explanations were given using a carbon-containing polycrystalline silicon layer as an example of an impurity thermal diffusion prevention layer; however, any layer of material which can trap impurities which diffuse due to heat treatment may be employed.

Further, in each of the above-described aspects, boron was used as a p-type impurity; but boron fluoride ($BF_2$), indium (In), or similar may be used. And, phosphorus was used as an n-type impurity; but arsenic (As), antimony (Sb) or similar may be used.

Also, in each of the above-described aspects, a metal silicide such as tungsten silicide was used as a metallic conduction layer; however, other metallic compounds such as cobalt silicide ($CoSi_x$), nickel silicide ($NiSi_x$), titanium silicide ($TiSi_x$), or molybdenum silicide ($MoSi_x$) may be used, or, a metal or alloy normally used as an electrode material may be employed.

This invention can be appropriately applied even when using a silicide method in which each of the MOSFETs are formed with cobalt silicide, titanium silicide, or other metal silicide layers provided in a self-aligned manner on the polycrystalline silicon layers comprised by each of the gate electrodes, and similar advantageous results can be expected.

This invention may also have the following favorable configurations when put to practical use.

A semiconductor device comprising, a p-type gate electrode, formed on a semiconductor substrate, comprising a polycrystalline silicon layer including a p-type impurity diffusion region in which are diffused p-type impurities, and a high-melting-point metal layer or high-melting-point metal silicide layer, formed in order, an n-type gate electrode, formed on said semiconductor substrate, comprising a polycrystalline silicon layer including an n-type impurity diffusion region in which are diffused n-type impurities, and a high-melting-point metal layer or high-melting-point metal silicide layer, and wherein an impurity thermal diffusion prevention layer, which prevents the diffusion of said impurities from said polycrystalline silicon layer, is provided at least between said polycrystalline silicon layer including said p-type impurity diffusion region, and said high-melting-point metal layer or high-melting-point metal silicide layer.

In the aforementioned the semiconductor device, an impurity thermal diffusion prevention layer is a carbon-containing polycrystalline silicon layer.

What is claimed is:

1. A method of manufacturing a semiconductor device comprising a first gate electrode, having a first impurity diffusion layer of a first conduction type formed in a polycrystalline silicon layer and a high-melting-point metal layer or high-melting-point metal silicide layer, formed in order, and a second gate electrode having a second impurity diffusion layer of a second conduction type formed in said polycrystalline silicon layer and a high-melting-point metal layer or high-melting-point metal silicide layer, formed in order, and positioned at a distance from said first gate electrode; wherein said method comprises:

(a) implanting impurities of the first and the second conduction types respectively into different first and second regions of the polycrystalline silicon layer from above said polycrystalline silicon layer;

(b) forming, after implanting impurities in the polycrystalline silicon layer, an impurity thermal diffusion prevention layer which prevents diffusion of said impurities implanted into the polycrystalline silicon layer on said polycrystalline silicon layer;

(c) forming said high-melting-point metal layer or high-melting-point metal silicide layer so as to cover said polycrystalline silicon layer extending from said first region to said second region, to form a compound layer comprising said polycrystalline silicon layer with said impurities implanted, said impurity thermal diffusion prevention layer, and said high-melting-point metal layer or high-melting-point metal silicide layer;

(d) heat-treating said compound layer, and diffusing said first and second impurities implanted respectively into said first and second regions in said polycrystalline silicon layer, to form said first and second impurity diffusion layers; and, (e) patterning a layered structure comprising said polycrystalline silicon layer in which are formed said first and second impurity diffusion layers, said impurity thermal diffusion prevention layer, and said high-melting-point metal layer or high-melting-point metal silicide layer, to form said first and second gate electrodes.

2. The semiconductor device manufacturing method according to claim 1, wherein, said impurity thermal diffusion prevention layer is provided so as to cover either one, or both, of said first and second regions.

3. The semiconductor device manufacturing method according to claim 2, wherein said impurity thermal diffusion prevention layer is provided so as to cover either one of said first or second regions by providing in advance, prior to implanting impurities into the polycrystalline silicon layer, a depression of depth corresponding to the layer thickness of said impurity thermal diffusion prevention layer from the surface of said polycrystalline silicon layer in the region of said polycrystalline silicon layer in which said impurity thermal diffusion prevention layer is to be provided.

4. The semiconductor device manufacturing method according to claim 3, wherein said impurity thermal diffusion prevention layer is formed to a thickness such that the surface of said layered structure is effectively flat.

5. The semiconductor device manufacturing method according to claim 1, wherein said impurity thermal diffusion prevention layer is a carbon-containing polycrystalline silicon layer.

6. The semiconductor device manufacturing method according to claim 5, wherein said carbon-containing polycrystalline silicon layer is formed by epitaxial growth using a compound gas containing carbon.

7. A semiconductor device manufacturing method, comprising:

(a) depositing a polycrystalline silicon layer on a semiconductor substrate;

(b) implanting p-type impurities into said polycrystalline silicon layer deposited in a region in which a p-type MOS transistor is to be formed on said semiconductor substrate surface, and implanting n-type impurities into said polycrystalline silicon layer deposited in a region in which an n-type MOS transistor is to be formed on said semiconductor substrate surface;

(c) forming an impurity thermal diffusion prevention layer, which prevents the diffusion of said impurities implanted into the polycrystalline silicon layer, either on said polycrystalline silicon layer deposited in the regions in which said p-type and n-type MOS transistors are to be formed, or, at least, on said polycrystalline silicon layer deposited in the region in which said p-type MOS transistor is to be formed;

(d) forming after said impurity thermal diffusion prevention layer, a high-melting-point metal layer or high-melting-point metal silicide layer so as to cover said polycrystalline silicon layer extending from the region in which said p-type MOS transistor is to be formed, to the region in which said n-type MOS transistor is to be formed;

(e) heat-treating said polycrystalline silicon layer, and diffusing said n-type and p-type impurities implanted into said polycrystalline silicon layer in said polycrystalline silicon layer, to form n-type and p-type impurity diffusion layers; and, (f) patterning, after diffusing said n-type and p-type impurities implanted into said polycrystalline silicon layer, said polycrystalline silicon layer in which are formed said n-type and p-type impurity diffusion layers, said impurity diffusion prevention layer, and said high-melting-point metal layer or high-melting-point metal silicide layer, to form the p-type gate electrode of said p-type MOS transistor and the n-type gate electrode of said n-type MOS transistor.

8. The semiconductor device manufacturing method according to claim 7, wherein, said impurity thermal diffusion prevention layer is provided only in the region in which said p-type MOS transistor is to be formed by providing a depression in advance, prior to forming said impurity thermal diffusion prevention layer, to a depth corresponding to the layer thickness of said impurity thermal diffusion prevention layer, in the surface of said polycrystalline silicon layer deposited in the region in which said p-type MOS transistor is to be formed.

9. The semiconductor device manufacturing method according to claim 8, wherein said impurity thermal diffusion prevention layer is formed to a thickness such that an effectively flat face is formed with the surface of said polycrystalline silicon layer deposited in the region in which said n-type MOS transistor is to be formed.

10. The semiconductor device manufacturing method according to claim 7, wherein said impurity thermal diffusion prevention layer is a carbon-containing polycrystalline silicon layer.

11. The semiconductor device manufacturing method according to claim 10, wherein said carbon-containing polycrystalline silicon layer is formed by epitaxial growth using a compound gas containing carbon.

12. A semiconductor device manufacturing method, comprising:

(a) depositing a polycrystalline silicon layer on a semiconductor substrate;

(b) forming an impurity thermal diffusion prevention layer which prevents the diffusion of impurities implanted into the polycrystalline silicon layer in a subsequent process, on said polycrystalline silicon layer deposited in a region in which a p-type MOS transistor is to be formed, wherein said impurity thermal diffusion prevention layer is formed by providing a depression in advance, prior to forming said impurity thermal diffusion prevention layer, in a surface of said polycrystalline silicon layer deposited in the region in which said p-type MOS transistor is to be formed, to a depth equivalent to a layer thickness of said impurity thermal diffusion prevention layer;

(c) implanting p-type impurities in said polycrystalline silicon layer deposited in the region on a surface of said semiconductor substrate in which the p-type MOS transistor is to be formed, and implanting n-type impurities in said polycrystalline silicon layer deposited in a region on a surface of said semiconductor substrate in which an n-type MOS transistor is to be formed;

(d) heat-treating said polycrystalline silicon layer, and diffusing said n-type and p-type impurities implanted into said polycrystalline silicon layer within said polycrystalline silicon layer, to form n-type and p-type impurity diffusion layers;

(e) forming after implanting the p-type impurities in said polycrystalline silicon layer, a high-melting-point metal layer or high-melting-point metal silicide layer so as to cover said polycrystalline silicon layer, extending from the region in which said p-type MOS transistor is to be formed to the region in which said n-type MOS transistor is to be formed; and (f) patterning after heat-treating said polycrystalline silicon layer, said polycrystalline silicon layer in which are formed said n-type and p-type impurity diffusion layers, said impurity thermal diffusion prevention layer, and said high-melting-point metal layer or high-melting-point metal silicide layer, to form a p-type gate electrode of said p-type MOS transistor and an n-type gate electrode of said n-type MOS transistor.

13. The semiconductor device manufacturing method according to claim 12, wherein said impurity thermal diffusion prevention layer is formed to a thickness such that an effectively flat face is formed with the surface of said polycrystalline silicon layer deposited in the region in which said n-type MOS transistor is to be formed.

14. The semiconductor device manufacturing method according to claim 12, wherein said impurity thermal diffusion prevention layer is formed to a thickness such that an effectively flat face is formed with the surface of said polycrystalline silicon layer deposited in the region in which said n-type MOS transistor is to be formed.

15. A semiconductor device manufacturing method, comprising:

(a) depositing a polycrystalline silicon layer on a semiconductor substrate;

(b) forming a carbon-containing polycrystalline silicon layer which prevents diffusion of impurities implanted into the polycrystalline silicon layer in a subsequent process, either on said polycrystalline silicon layer deposited in regions on said semiconductor substrate in which p-type and n-type MOS transistors are to be formed, or, at least on said polycrystalline silicon layer deposited in the region in which said p-type MOS transistor is to be formed;

(c) implanting p-type impurities in said polycrystalline silicon layer deposited in the region on a surface of said semiconductor substrate in which the p-type MOS transistor is to be formed, and implanting n-type impurities in said polycrystalline silicon layer deposited in the region on a surface of said semiconductor substrate in which the n-type MOS transistor is to be formed;

(d) heat-treating said polycrystalline silicon layer, and diffusing said n-type and p-type impurities implanted into said polycrystalline silicon layer within said polycrystalline silicon layer, to form n-type and p-type impurity diffusion layers;

(e) forming after implanting the p-type impurities is said polycrystalline silicon layer, a high-melting-point metal layer or high-melting point metal silicide layer so as to cover said polycrystalline silicon layer, extending from the region in which said p-type MOS transistor is to be formed to the region in which said n-type MOS transistor is to be formed, and (f) patterning after heat-treating said polycrystalline silicon layer, said polycrystalline silicon layer in which are formed said n-type and p-type impurity diffusion layers, said carbon-containing polycrystalline silicon layer, and said high-melting-point metal layer or high-melting-point metal silicide layer, to form a p-type gate electrode of said p-type MOS transistor and an n-type gate electrode of said n-type MOS transistor.

16. The semiconductor device manufacturing method according to claim 15, wherein said carbon-containing polycrystalline silicon layer is formed by epitaxial growth using a compound gas containing carbon.

* * * * *